(12) United States Patent
Benlarbi et al.

(10) Patent No.: US 8,560,142 B2
(45) Date of Patent: Oct. 15, 2013

(54) ADAPTIVE COOLING USING SELECTABLE TARGET USEFUL LIFE

(75) Inventors: Saida Benlarbi, Ottawa (CA); David Stortz, Kanata (CA); Dmitri Garaschenko, Ottawa (CA)

(73) Assignee: Alcatel Lucent, Paris (FR)

( * ) Notice: Subject to any disclaimer, the term of this patent is extended or adjusted under 35 U.S.C. 154(b) by 243 days.

(21) Appl. No.: 12/976,442

(22) Filed: Dec. 22, 2010

(65) Prior Publication Data

US 2012/0160444 A1 Jun. 28, 2012

(51) Int. Cl.
*G05D 23/00* (2006.01)

(52) U.S. Cl.
USPC .......................................... 700/300; 700/278

(58) Field of Classification Search
None
See application file for complete search history.

(56) References Cited

U.S. PATENT DOCUMENTS

| 7,426,109 | B2 | 9/2008 | Lindell et al. |
| 7,490,479 | B2 | 2/2009 | Byquist et al. |
| 7,708,056 | B2 | 5/2010 | Shen et al. |
| 7,711,659 | B2 | 5/2010 | de la Guardia et al. |
| 2006/0142901 | A1* | 6/2006 | Frankel et al. ................. 700/300 |
| 2006/0161307 | A1* | 7/2006 | Patel et al. .................... 700/277 |

FOREIGN PATENT DOCUMENTS

| CA | 2676213 | 2/2010 |
| JP | 2011085323 | 3/1999 |
| JP | 2007293605 | 11/2007 |

OTHER PUBLICATIONS

International Search Report dated Mar. 8, 2012 for PCT/CA2011/050750.

\* cited by examiner

*Primary Examiner* — Sean Shechtman
(74) *Attorney, Agent, or Firm* — Kramer & Amado P.C.

(57) ABSTRACT

A method and system is disclosed for controlling cooling unit operational settings according to a desired useful life target. The method and system includes an adaptive cooling controller which uses system configuration information to associate a particular cooling unit with particular sub-equipment locations, and further uses configuration information to associate cooling unit activity with respective sensors. At a given cooling unit setting, the adaptive cooling controller determines from sensor readings in the associated sub-equipment whether a cooling unit setting change is required according to the configuration information for the sub-equipment in conjunction with a useful life target. The method and system is particularly useful for overcoming the difficulty with accommodating sub-equipment changes of cooling unit controllers known in the art.

25 Claims, 4 Drawing Sheets

ADAPTIVE COOLING USING SELECTABLE TARGET USEFUL LIFE

FIELD OF THE INVENTION

The invention is directed to equipment cooling and in particular cooling performance directed to a desired useful life.

BACKGROUND OF THE INVENTION

Electronic components are in general subject to at least two stresses, an electrical stress, with increasing tendency to breakdown due to voltage, current or power and a thermal stress due to its own power dissipation and, in part, to the total dissipation of neighboring components and/or the local environment. Reducing electrical and thermal stress leads to products improved failure rates and extended useful life. This is a design aspect defined as component de-rating.

In most industries and in particular the Telecom industry this aspect is statically defined at the design phase of a product and is hard to change later on in the product life cycle since it does entitle a high cost both in terms of CAPEX and OPEX. To make sure the product meets its target worst case scenario operating conditions its components de-rating or stress reduction is usually targeted for the product maximum configuration and power load to avoid product operational degradation and failures for all the committed operating conditions ranges. For e.g. a shelf assembly having a battery of cooling air intake fans will have fan speed and volumetric capacity sized to accommodate worst-case power dissipation and environmental temperature conditions over which the total equipment is specified to operate.

However in most of the cases a significant portion of the equipment operates below the worst case conditions. Moreover the same given product can be targeted to different target useful life depending on the target market drivers (cost reductions, large variability in deployment sites environmental conditions, etc.). Hence designing the product with static de-rating limits without the ability to reduce or adjust the product cooling capabilities to meet dynamically changing useful life targets makes the product incur high design and deployment costs. For example a system designed to meet 20 years useful life for central office conditions with temperature range of −5 to +40 C cannot be adapted to run in extended temperature ranges say −40 C to +65 C by adjusting the system thermal flow to adjust the de-rating levels needed to meet 5 or 10 years useful life without the need to re-design or redeploy the product.

Further, though most of existing electronic systems thermal solutions work on preset cooling levels which can often be dynamically adjusted to air intake temperatures, they do not adapt per the internal system configuration or its electrical load changes which have to meet specific reliability targets. This results most of the time in inefficient system designs that drive overly high the cost of developing and operating such systems. Usually the amount of cooling delivered is engineered to allow a product quantified reliability and useful life target by designing the max components de-ratings.

Disadvantageously, provision of excess cooling capacity can result in significant wasted power, reduced product reliability and shortened useful life of fans, as well as high noise levels.

SUMMARY OF THE INVENTION

It is an object of the invention to provide an improved form of adaptive cooling adapted to a selectable reliability target or a selectable useful life target.

According to an aspect of the invention there is provided a method for adjusting the setting of a cooling unit, the method having the steps of reading system configuration information and desired useful life target information; associating, based upon the system configuration information, a sensor group associated with the cooling unit; obtaining sensor readings for the sensor group associated with the cooling unit; determining based upon the sensor readings, the system configuration information, and the desired useful life target information a value for a setting change to the cooling unit; and applying the setting change to the cooling unit.

In some embodiments the cooling unit is a fan and the setting is a fan speed setting and the system configuration information identifies an association between the cooling unit and at least one sub equipment location. Also, the system configuration information may identify an association between at least one sub-equipment location and an apparatus installed at that sub-equipment location. In some embodiments the sub equipment location is a circuit card slot in an equipment shelf.

In some embodiments the system configuration information further has apparatus configuration information associated with the apparatus situated at the sub-equipment location. This apparatus configuration information may be an association between a cooling unit setting and a threshold value reading for the sensors associated with the apparatus wherein the threshold value reading for the sensors is associated with a specific useful life target. In some versions of the embodiments a guard band is associated with the threshold sensor value reading.

According to one embodiment, if any of the sensor readings for the sensor group associated with the cooling unit exceed their respective threshold value plus the guard band value, then the setting change value is such as to increase the cooling effect of the cooling unit. Alternatively, if all of the sensor readings for the sensor group associated with the cooling unit are less than their respective threshold value minus the guard band value, then the setting change value is such as to decrease the cooling effect of the cooling unit. Further, if none of the sensor readings for the sensor group associated with the cooling unit exceed their respective threshold value plus the guard band value, and if at least one of the sensor readings for the sensor group associated with the cooling unit is within the guard band value range of their respective threshold value, then the setting change value is such as to not change the cooling effect of the cooling unit.

According to another aspect of the invention there is disclosed a system for controlling the setting of a cooling unit, the system having an adaptive cooling controller; a first system configuration information relating a sub-set of sensors to the cooling unit; a second system configuration information relating sensor readings to cooling unit settings; a useful life target value; and whereby the adaptive cooling controller obtains sensor readings from the sub-set of sensors specified by the first system configuration information, determines a setting change value for a setting change to the cooling unit based upon the sensor readings and the second system configuration information in combination with the useful life target value; and changes the setting of the cooling unit according to the setting change value.

In some embodiments of this aspect, the cooling unit is a fan, the sensors are temperature sensors, and the setting corresponds to a speed of the fan.

In some embodiments the first system configuration information further associates the cooling unit to at least one sub-equipment location and a portion of the sub-set of sensors are located at the at least one sub-equipment location. Additionally, a portion of the sub-set of sensors is located so as to sense an ambient condition.

In some embodiments the second system configuration information has an association between a cooling unit setting and a threshold value reading for the sub-set of sensors. In these embodiments there may be a guard band associated with the respective threshold value.

According to one embodiment, if any of the sensor readings have values which exceed the respective threshold value plus the guard band value for that sensor at the present cooling unit setting, then the adaptive cooling controller determines a value for a setting change which increases the cooling effect of the cooling unit. Alternatively, if all of the sensor readings have values which are below the respective threshold value minus the guard band value for that sensor at the present cooling unit setting, then the adaptive cooling controller determines a value for a setting change which decreases the cooling effect of the cooling unit. Further, if none of the sensor readings have values which exceed the respective threshold value plus the guard band value for that sensor at the present cooling unit setting, and if at least one of the sensor readings is within the guard band value range of the respective threshold value, then the adaptive cooling controller determines a value for a setting change which does not alter the cooling effect of the cooling unit.

In some of the contemplated embodiments, the cooling unit is a fan, the sensors are temperature sensors, and the setting change is associated with a change in fan speed.

Note: in the following description and drawings that follow merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWINGS

The foregoing and other objects, features and advantages of the invention will be apparent from the following more particular description of the preferred embodiments, as illustrated in the appended drawings, where.

In the following figures, like features bear similar reference labels.

DETAILED DESCRIPTION

Figure 1:
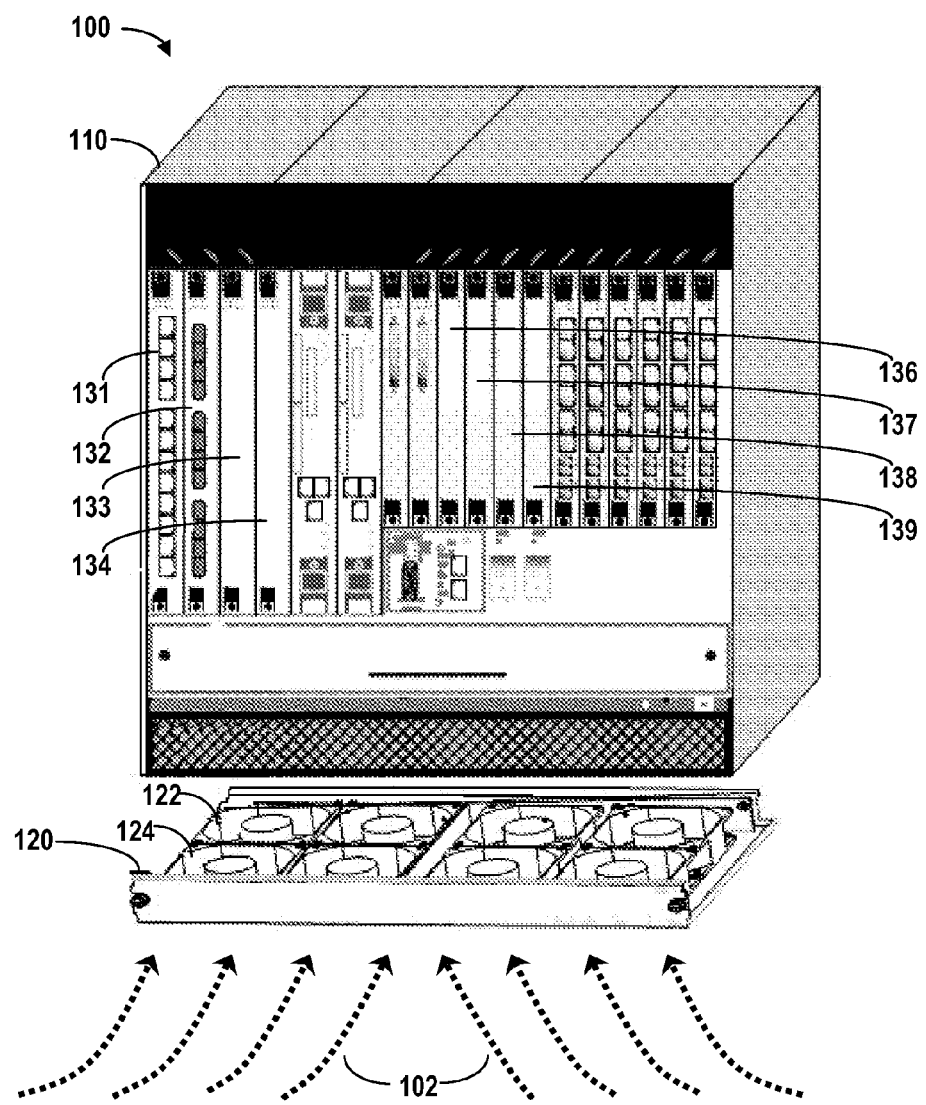
FIG. 1 illustrates a cooling enclosure for housing equipment having cooling needs according to a possible embodiment of the invention.

Referring to FIG. 1 there may be seen a cooling system 100 according to an embodiment of the present invention. Enclosure 110 provides a mechanical frame in which electronic circuit cards or modules are disposed. In this embodiment the circuit cards are disposed in slots, similar to books along a shelf, and four such circuit cards 131, 132, 133, and 134 are indicated. The remaining slots are filled with further circuit cards, some of which may be for the purposes of facilitating cooling air flow as will be described below.

Shown in exploded view below enclosure 110 is fan assembly 120 which contains a plurality of fans mounted so as to draw in cooling air 102 and circulating such air into and through the circuit cards which are disposed in enclosure 110. The design of enclosure 110 is such that after circulating past the circuit cards, the warmed cooling air is exhausted through ports (not shown in FIG. 1), for example at the rear of the enclosure. Fan assembly 120 has been shown separated from the enclosure 110 for the purposes of this description, but in operation is located within or abutting the bottom of the enclosure, and secured so that cooling air drawn in by the plurality of fans is directed substantially upwards into the enclosure. Also visible mounted within fan assembly 120 are fan 122 and fan 124 as well as further fans.

Under some scenarios, not all circuit cards mounted in enclosure 110 contain circuitry. In the example embodiment of FIG. 1, circuit cards 136, 137, 138 and 139 do not have electrical circuitry. Their presence in the system is for the purposes of preventing air flow from escaping from the enclosure by providing faceplates, and under some implementations, to provide a means of blocking airflow from passing through the location they occupy. This blockage facilitates the directing of the flow of cooling air to the cards which actually require cooling.

The fans located in fan assembly 120 have their speed controlled by fan speed controllers (not shown) which allow the RPM of a fan to be set and monitored.

The circuit cards disposed within enclosure 110 are equipped with at least one, and possibly a plurality of temperature sensors in the event that the particular circuit card requires cooling air flow to be adjusted. The temperature sensors generate a reading representative of a measured temperature in the vicinity of the sensor.

Figure 2:
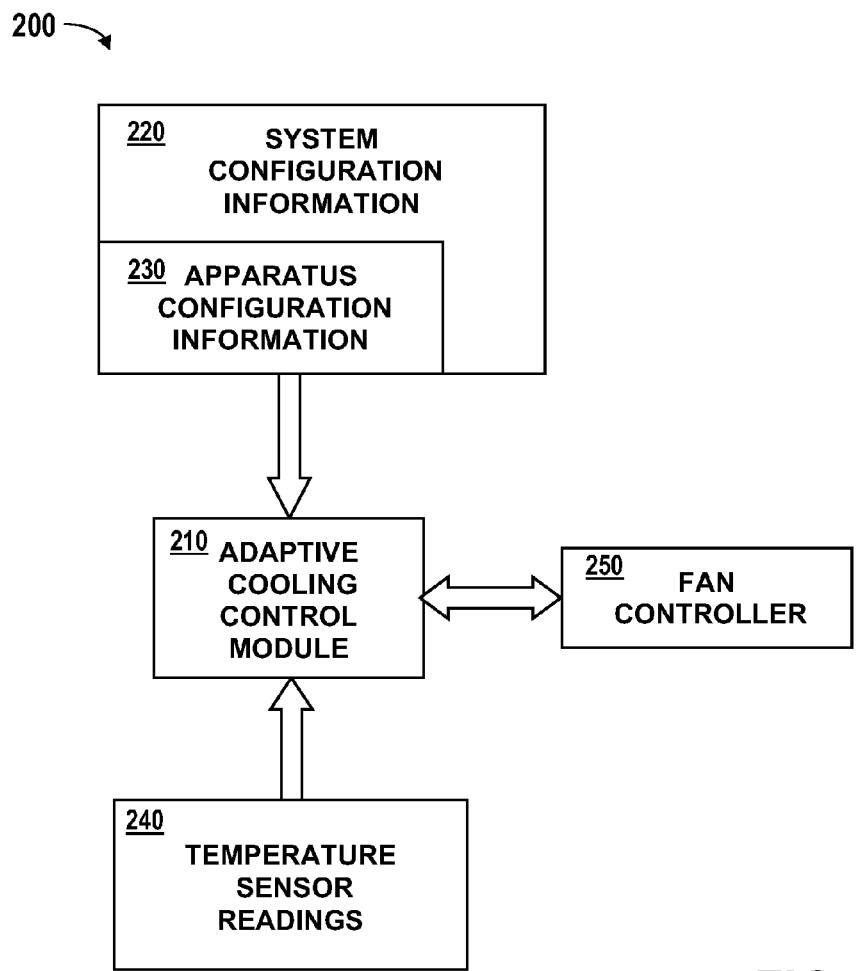
FIG. 2 illustrates a block diagram of an adaptive cooling system according to an embodiment of the invention.

Referring now to FIG. 2, there may be seen a block diagram 200 of an adaptive cooling system according to an embodiment of the invention. At the central position of the block diagram may be seen adaptive cooling control module (ACCM) 210. This module is preferentially implemented as a series of functions described via software for execution upon a processor, although alternative implementations are discussed in reference to FIG. 4 below.

Accessible to ACCM 210 is system configuration information 220 and apparatus configuration information 230. This information identifies several important considerations to ACCM 210. System configuration information 220 identifies which fans' air flow is associated with which apparatus mounting slot in enclosure 110. For example, referring to FIG. 1, system configuration information 220 would identify that the enclosure slots containing circuit cards 131, 132, 133, and 134 are associated with the air flow provided by fans 122 and 124. Secondly, system configuration information 220 identifies the type of apparatus equipped in the enclosure slots.

By way of example, according to one embodiment of the invention, system configuration information 220 may consist of information as contained in Table 1.

TABLE 1

| Slot # | Card Type | Fan(s) # in direct air path |
|---|---|---|
| 1 | Gigabit Ethernet | 1 (122); 2 (124) |
| 2 | Ethernet | 1 (122); 2 (124) |
| 3 | Empty (Impedance) | 1 (122); 2 (124) |
| 4 | Empty (Impedance) | 1 (122); 2 (124) |
| 5 | Control | 3; 4 |
| 6 | Control | 3; 4 |
| 7 | ATM | 3; 4 |
| 8 | ATM | 3; 4 |
| 9 | Empty (Impedance) | 5; 6 |
| 10 | Empty (Impedance) | 5; 6 |
| 11 | Empty (Impedance) | 5; 6 |
| 12 | Empty (Impedance) | 5; 6 |
| etc | etc | etc |

Also accessible to ACCM 210 as part of system configuration information 220 is apparatus configuration information 230. This information provides ACCM 210 with relations between temperatures as measured by the temperature sensors contained on the apparatus equipped in a slot of enclosure 110, and fan speed requirements for the fans associated with that slot.

By way of example, according to one embodiment of the invention, apparatus configuration information 230 may consist of information as contained in TABLE 2. In this table may be seen an association of Fan speed in RPM with maximum temperature readings for a first and second temperature sensor located on each card, and for an air inlet temperature sensor.

TABLE 2

Gigabit Ethernet Card

| | Fan speed, RPM | | | | | | |
|---|---|---|---|---|---|---|---|
| | 0 | 1k | 2k | 3k | 4.5k | 5.5k | 6.5k |
| Maximum Card Sensor 1 Readings, ° C. | 65 | 40 | 45 | 65 | 75 | 85 | 90 |
| Maximum Card Sensor 2 Readings, ° C. | 65 | 40 | 45 | 65 | 80 | 90 | 95 |
| Air Inlet Ambient Temperatures, ° C. | −20 | −10 | 0 | 25 | 40 | 55 | 65 |

ATM Card

| | Fan speed, RPM | | | | | | |
|---|---|---|---|---|---|---|---|
| | 0 | 1k | 2k | 3k | 4k | 5k | 6k |
| Maximum Card Sensor 1 Readings, ° C. | 55 | 30 | 35 | 55 | 65 | 75 | 80 |
| Maximum Card Sensor 2 Readings, ° C. | 50 | 25 | 30 | 50 | 60 | 70 | 75 |
| Air Inlet Ambient Temperatures, ° C. | −20 | −10 | 0 | 25 | 40 | 55 | 65 |

ETHERNET Card

| | Fan speed, RPM | | | | | | |
|---|---|---|---|---|---|---|---|
| | 0 | 2k | 3k | 4k | 5k | 6k | 7k |
| Maximum Card Sensor 1 Readings, ° C. | 60 | 35 | 40 | 60 | 70 | 80 | 85 |
| Maximum Card Sensor 2 Readings, ° C. | 70 | 40 | 45 | 65 | 75 | 85 | 90 |
| Air Inlet Ambient Temperatures, ° C. | −20 | −10 | 0 | 25 | 40 | 55 | 65 |

TABLE 2-continued

CONTROL Card

| | Fan speed, RPM | | | | | | |
|---|---|---|---|---|---|---|---|
| | 0 | 2k | 3k | 4k | 5k | 6k | 7k |
| Maximum Card Sensor 1 Readings, ° C. | 65 | 40 | 45 | 65 | 75 | 85 | 90 |
| Maximum Card Sensor 2 Readings, ° C. | 80 | 50 | 55 | 75 | 85 | 95 | 100 |
| Air Inlet Ambient Temperatures, ° C. | −30 | −10 | 0 | 25 | 40 | 55 | 65 |

The highest RPM required over the operating temperature range is defined per card based on thermal testing results performed during card's design and verification, and can be updated in the field if via updating apparatus configuration information 230 if the card's thermal profile has changed for some reason (for example, a newer SW load, new substitution part, etc. . . . ).

The temperatures listed in TABLE 2 represent the threshold temperature for the highest allowable temperature at the given fan RPM. In general, if at a given fan RPM the temperature observed on a sensor is in excess of the value indicated in the table, then the fan speed is increased. Likewise, if the temperature observed on a sensor is below the value indicated in the table, the fan speed may be decreased.

In order to prevent speed oscillations or hunting for appropriate fan speeds, a guard band of temperatures is established around the indicated temperature. This guard band is normally specified in the system configuration information 220, but may also be stored in the ACCM 210. This guard band may be a range of temperatures ±2° around the indicated temperature, or ±4°, or ±6°, or another appropriate range as determined by either enclosure design or via equipment characterization. Should the measured temperature fall within the specified guard band for that sensor, then no change in fan RPM is required.

Referring back to FIG. 2, the ACCM 210 is also connected to fan controller 250 to which it provides fan speed requirements. Fan controller 250 then provides appropriate drive voltages to the individual fans located in fan assembly 120 so as to set them to the speed as specified by ACCM 210.

According to one embodiment of the invention, operation of the ACCM 210 in order to provide appropriate cooling air flow to the furnished apparatus is as follows.

Using the information provided in the system configuration information 220, the ACCM 210 can associate a group of temperature sensors located upon equipment installed in the enclosure slots to a particular fan. The group of sensors associated with a particular fan may be referred to as the Fan Sensor Group (FSG). By way of example, referring to TABLE 1, the FSG for fan 1 (fan 122 of FIG. 1) are the temperature sensors associated with the first four enclosure slots (any temperature sensors on apparatus cards 131, 132, 133, and 134 of FIG. 1) and in the case that inlet air ambient temperature sensors are provided, also those sensors.

For each fan, the ACCM 210 collects sensor readings for the fan's respective FSG. As the RPM of the fan is known, as the ACCM 210 has set it, then the ACCM 210 may use the data provided by the apparatus configuration information 230 to determine if any of the temperature sensors of a particular FSG exceed their highest allowable (plus guard band) temperatures. If any sensor in the FSG exceeds, then the speed of the respective fan is increased. If none of the temperature readings of the FSG are above the threshold temperature (plus guard band), then the present fan speed is not too low. ACCM 210 then determines if any of the temperature readings are within their respective guard band for that fan speed. If none of the temperature readings are within their respective guard bands, then all temperatures must be below threshold and the present fan speed may be decreased, and the ACCM 210 instructs fan controller 250 to do so for this fan. However, if at this point, at least one sensor reading within the FSG is within its respective guard band, then the fan speed need neither be increased nor decreased.

By referring to TABLE 2 it may be seen that the fan speeds given for a particular card are not specified for other apparatus. For example, the Gigabit Ethernet Card entry in the table specifies sensor temperatures for a fan speed of 5.5 k RPM, while the other cards of TABLE 2 only specify sensor temperatures for fan speeds of 5 k RPM and 6 k RPM. Under circumstances where a fan speed is set and no specific temperature is given for the apparatus which is part of the FSG, the ACCM 210 will calculate an appropriate temperature for the sensor at issue. This calculation may be performed by using routine linear interpolation or extrapolation from the threshold temperatures provided.

The reliability and useful life targets for which the apparatus configuration information in TABLE 2 was derived represents a particular instance of reliability and useful life. Depending on customer requirements, there may be alternative instances desired. Under such circumstances, the apparatus configuration information 230 may be supplemented by further instances of relations between temperatures as measured by the temperature sensors contained on the apparatus equipped in a slot of enclosure 110, and fan speed requirements for the fans associated with that slot, wherein the further instances are representative of relations for different instances of reliability and useful life.

By way of example, according to one embodiment of the invention, apparatus configuration information 230 may further consist of information as contained in TABLE 3. In this table may be seen an association of Fan speed in RPM with maximum temperature readings for a first and second temperature sensor located on each card, and for an air inlet temperature sensor for a particular target life. For the purposes of this example, multiple instances for one particular card are shown. In actual embodiments, there will typically be multiple instances for each of the cards or sub-equipment provided.

TABLE 3

Gigabit Ethernet Card 20 Years

| | Fan speed, RPM | | | | | |
|---|---|---|---|---|---|---|
| | 0 | 1K | 2K | 3K | 4.5K | 5.5K | 6.5K |
| Max Card Sensor 1 Readings, ° C. | 65 | 40 | 45 | 65 | 75 | 85 | 90 |
| Max Card Sensor 2 Readings, ° C. | 65 | 40 | 45 | 65 | 80 | 90 | 95 |
| Air Inlet Ambient Temperatures, ° C. | −20 | −10 | 0 | 25 | 40 | 55 | 65 |

Gigabit Ethernet Card 15 Years

| | Fan speed, RPM | | | | | |
|---|---|---|---|---|---|---|
| | 0 | 0 | 1k | 2k | 3k | 4.5k | 5.5k |
| Max Card Sensor 1 Readings, ° C. | 75 | 75 | 65 | 75 | 85 | 90 | 90 |
| Max Card Sensor 2 Readings, ° C. | 75 | 75 | 65 | 80 | 90 | 95 | 95 |
| Air Inlet Ambient Temperatures, ° C. | −20 | −10 | 0 | 25 | 40 | 55 | 65 |

TABLE 3-continued

Gigabit Ethernet Card 10 Years

| | Fan speed, RPM | | | | | |
|---|---|---|---|---|---|---|
| | 0 | 0 | 0 | 1k | 2k | 4.5k | 5.5k |
| Max Card Sensor 1 Readings, ° C. | 85 | 85 | 85 | 85 | 90 | 90 | 90 |
| Max Card Sensor 2 Readings, ° C. | 85 | 85 | 85 | 90 | 95 | 95 | 95 |
| Air Inlet Ambient Temperatures, ° C. | −20 | −10 | 0 | 25 | 40 | 55 | 65 |

Gigabit Ethernet Card 5 Years

| | Fan speed, RPM | | | | | |
|---|---|---|---|---|---|---|
| | 0 | 0 | 0 | 1k | 1k | 4.5k | 5.5k |
| Max Card Sensor 1 Readings, ° C. | 90 | 90 | 90 | 90 | 90 | 90 | 90 |
| Max Card Sensor 2 Readings, ° C. | 95 | 95 | 95 | 95 | 95 | 95 | 95 |
| Air Inlet Ambient Temperatures, ° C. | −30 | −10 | 0 | 25 | 40 | 55 | 65 |

By reference to TABLE 3 it is apparent that as shorter life spans are selected, lower fan speed RPMs are associated with higher sensor temperatures. As well, inspection of TABLE 3 shows that with a fan turned off (a Fan speed of 0 RPM), internal equipment temperature rises are accounted for by increased sensor threshold values. As may be seen, as shorter life spans are selected, the equipments' internal operating temperatures are changed by allowing higher temperatures. This allows for lower fan speeds, increasing power savings due to lower fan motor power consumption.

Figure 3:
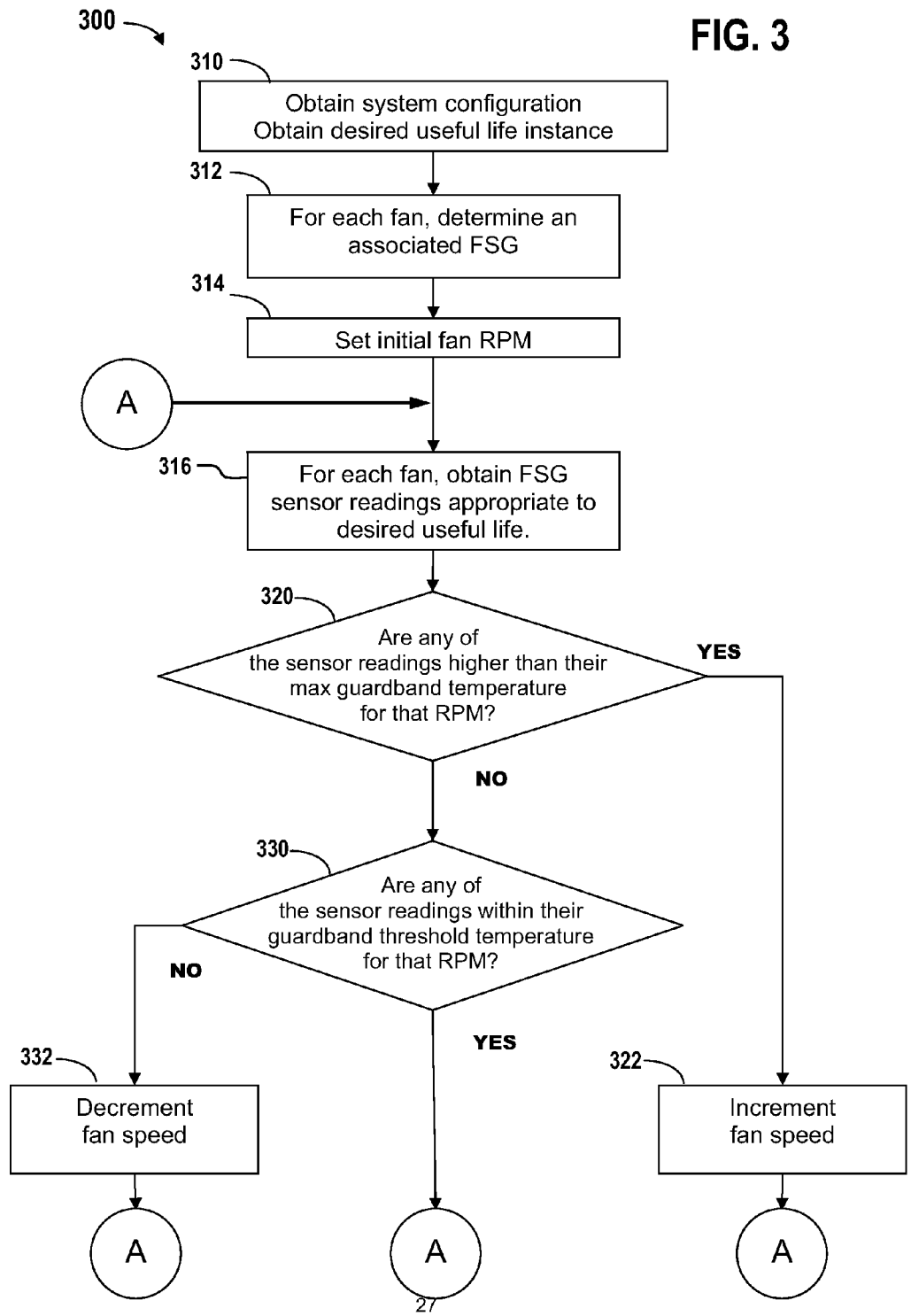
FIG. 3 depicts a flow chart according to an embodiment of the invention.

Referring now to FIG. 3, there may be seen a flow diagram depicting the method just described. Commencing at step 310, the ACCM obtains system configuration information, including apparatus configuration information, and the desired useful life. At step 312 it uses this information to identify fan sensor groups (FSGs) for each fan requiring controlling. At step 314 an initial fan RPM is set on each fan. This initial fan RPM may be a nominal value, for example, 50% of the fan's maximum RPM; or it may be 0 RPM in the case that the equipment is known to be located in a low temperature environs and it is not desirable to start the fans at very low temperatures; or alternatively the initial fan RPM may be derived from the fan settings appropriate to the FSG, for example the second highest RPM provided for the apparatus associated with the FSG.

Moving now to step 316, for each fan the ACCM obtains sensor readings from the sensors within each FSG. These temperature readings are obtained after a sufficient time delay for the sensors to reflect the effects of the set fan RPM.

At step 320 the ACCM ascertains if any of the sensor readings within the FSG under consideration are higher than the associated temperature threshold plus guard band for that sensor using temperature thresholds appropriate to the desired life target instance. If any of the sensor readings are in excess of the associated temperature threshold plus guard band, then the process goes to step 322 where the ACCM increments the fan speed. Control then passes back to step 316 to ascertain the effects of the fan speed change.

Alternatively, if at step 320 none of the sensor readings within the FSG under consideration are higher than the associated temperature threshold plus guard band for that sensor, then control passes to step 330.

At step 330 the ACCM determines if any of the sensor readings within the FSG under consideration are within the guard band around the associated temperature threshold for that sensor. If none of the sensor readings within the FSG under consideration are within the guard band around the associated temperature threshold for that sensor, then the process goes to step 332 where the ACCM decrements the fan speed. Control then passes back to step 316 to ascertain the effects of the fan speed change.

Alternatively, if at step 330 at least of the sensor readings within the FSG under consideration are within the guard band around the associated temperature threshold for that sensor, then the speed of that particular fan need not be incremented nor decremented at this point in time. Control then passes back to step 316 to monitor the ongoing performance.

In the embodiment described above, the apparatus was equipped each with a pair of temperature sensors. This was for illustrative purposes only, as alternative embodiments may employ only a single sensor. In general, however, a plurality of sensors is preferred for reliability purposes so that no single sensor failure precludes the ACCM from operating.

Figure 4:
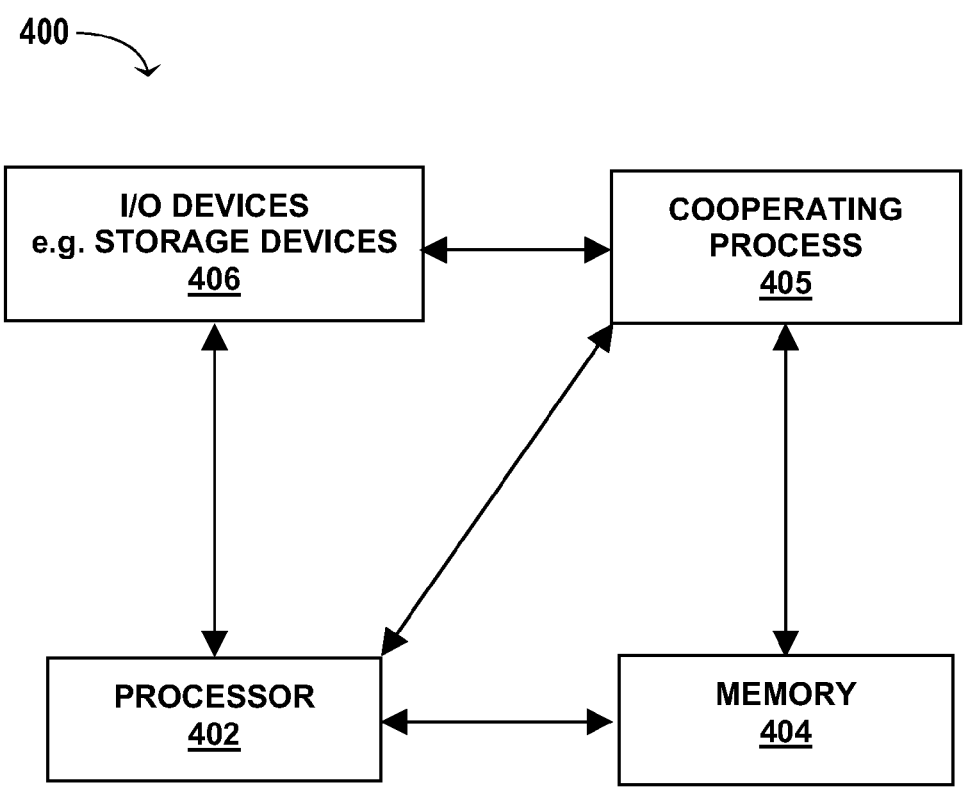
FIG. 4 depicts a high-level block diagram of a computer subsystem suitable for use in performing functions described herein.

Referring to FIG. 4, there may be seen a high-level block diagram of a computer subsystem suitable for use in performing functions described herein.

As depicted in FIG. 4, computer subsystem 400 includes a processor element 402 (e.g., a central processing unit (CPU) and/or other suitable processor(s)), a memory 404 (e.g., random access memory (RAM), read only memory (ROM), and the like), a cooperating module/process 405, and various input/output devices 406 (e.g., storage devices (e.g., a tape drive, a floppy drive, a hard disk drive, a compact disk drive, a non-volatile memory device, and the like; or alternatively a connection to another processor)).

It will be appreciated that the functions depicted and described herein may be implemented in software and/or hardware, e.g., using a general purpose computer, one or more application specific integrated circuits (ASIC), and/or any other hardware equivalents. In one embodiment, the cooperating process 405 can be loaded into memory 404 and executed by processor 402 to implement the functions as discussed herein. Thus, cooperating process 405 (including associated data structures) can be stored on a computer readable storage medium, e.g., RAM memory, magnetic or optical drive or diskette, non-volatile memory devices, and the like.

It is contemplated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in non-transitory and tangible fixed or removable media, and/or stored within a memory within a computing device operating according to the instructions.

In summary, a method and has been disclosed which provides a means to use system configuration information to adapt cooling unit settings, for example fan speed settings, to the requirements of the specific equipment furnished. The method and system uses system configuration information to associate cooling units to sub-equipment locations, to associate sensors at those and other locations with the cooling units, and to determine which variations in settings are appropriate at a given instant of operation.

It is to be understood that various changes in the details, materials, and arrangements of the parts which have been described and illustrated in order to explain the nature of this invention may be made by those skilled in the art without departing from the scope of the invention as expressed in the following claims.

It should also be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation." Numerous modifications, variations and adaptations may be made to the embodiment of the invention described above without departing from the scope of the invention, which is defined in the claims.

What is claimed is:

1. A method for adjusting a cooling unit, the method comprising:
    reading system configuration information for at least one sub-equipment location and desired useful life target information;
    associating, based upon the system configuration information, a sensor group associated with said cooling unit;
    obtaining sensor readings from the at least one sub-equipment location for the sensor group associated with said cooling unit;
    determining, based upon the obtained sensor readings, the system configuration information, and the desired useful life target information, a non-zero speed setting for said cooling unit; and
    applying said non-zero speed setting to said cooling unit.

2. The method of claim 1, wherein said cooling unit comprises a fan and said non-zero speed setting comprises a fan speed setting.

3. The method of claim 1, wherein said system configuration information comprises an association between said cooling unit and the at least one sub-equipment location.

4. The method of claim 3, wherein said sub-equipment location comprises a circuit card slot in an equipment shelf.

5. The method of claim 1, wherein said system configuration information comprises an association between the at least one sub-equipment location and an apparatus installed therein.

6. The method of claim 5, wherein said system configuration information further comprises apparatus configuration information associated with said apparatus.

7. The method of claim 6, wherein said apparatus configuration information comprises an association between the non-zero speed setting and a threshold value reading for the sensor group, wherein said threshold value reading for the sensor group is associated with a specific useful life target value.

8. The method of claim 7, wherein said determining step further comprises:
associating a guard band with said threshold value reading; and
if any sensor readings for the sensor group associated with said cooling unit exceed their respective threshold value plus said guard band value, then increasing the non-zero speed setting of said cooling unit.

9. The method of claim 8, wherein said cooling unit comprises a fan and said sensors comprise temperature sensors.

10. The method of claim 7, wherein said determining step further comprises:
associating a guard band value with said threshold value reading; and
if all of the sensor readings for the sensor group associated with said cooling unit are less than their respective threshold value minus said guard band value, then decreasing the non-zero speed setting of said cooling unit.

11. The method of claim 10, wherein said cooling unit comprises a fan and said sensors comprise a temperature sensors.

12. The method of claim 7, wherein said determining step further comprises:
associating a guard band value with said threshold value reading; and
if none of the sensor readings for the sensor group associated with said cooling unit exceed their respective threshold value plus said guard band value, and if at least one of the sensor readings for the sensor group associated with said cooling unit is within said guard band value range of their respective threshold value, then maintaining the non-zero speed setting of said cooling unit.

13. The method of claim 12, wherein said cooling unit comprises a fan and said sensors comprise temperature sensors.

14. A system for controlling a cooling unit, the system comprising:
an adaptive cooling controller;
a first system configuration device configured to relate a sub-set of sensors from at least one sub-equipment location to said cooling unit;
a second system configuration device configured to relate sensor readings from the at least one sub-equipment location to cooling unit settings;
a device configured to store a useful life target value, wherein the adaptive cooling controller obtains sensor readings from said sub-set of sensors specified by said first system configuration device, determines a non-zero speed setting for said cooling unit based upon said sensor readings and said second system configuration device in combination with said useful life target value, and changes a non-zero speed setting of said cooling unit according to said setting change value.

15. The system as claimed in claim 14, wherein said cooling unit is a fan and said sub-set of sensors are temperature sensors.

16. The system as claimed in claim 14, wherein said first system configuration device further associates said cooling unit to the at least one sub-equipment location.

17. The system as claimed in claim 14, wherein a portion of said sub-set of sensors are configured to sense an ambient condition.

18. The system as claimed in claim 14, wherein said second system configuration device is configured to associate the non-zero speed setting and a threshold value reading for the sub-set of sensors.

19. The system as claimed in claim 18, wherein said second system configuration device is configured to associate the non-zero speed setting and a respective threshold value reading for a portion of sensors in the sub-set of sensors.

20. The system as claimed in claim 19, wherein a guard band is associated with said respective threshold value, and if any of said sensor readings for said portion of sensors have values which exceed the respective threshold value plus a guard band value for that sensor at a present cooling unit setting, then the adaptive cooling controller increases the non-zero speed of said cooling unit.

21. The system as claimed in claim 20, wherein said cooling unit is a fan, said sub-set of sensors are temperature sensors, and said non-zero speed setting is associated with an increase in fan speed.

22. The system as claimed in claim 19, wherein a guard band is associated with said respective threshold value, and if all of said sensor readings for said portion of sensors have values which are below the respective threshold value minus a guard band value for that sensor at a present cooling unit setting, then the adaptive cooling controller decreases the non-zero speed setting of said cooling unit.

23. The system as claimed in claim 22, wherein said cooling unit is a fan, said sub-set of sensors are temperature sensors, and said non-zero speed setting is associated with an decrease in fan speed.

24. The system as claimed in claim 19, wherein a guard band is associated with said respective threshold value, and if none of said sensor readings for said portion of sensors have values which exceed the respective threshold value plus a guard band value for that sensor at a present cooling unit setting, and if at least one of the sensor readings of said portion of sensors is within a guard band value range of said respective threshold value, then the adaptive cooling controller maintains the non-zero speed setting of said cooling unit.

25. The system as claimed in claim 24, wherein said cooling unit is a fan, said sub-set of sensors are temperature sensors, and said non-zero speed setting is associated with a negligible change in fan speed.

* * * * *